United States Patent
Huang

[11] Patent Number: 6,051,345
[45] Date of Patent: Apr. 18, 2000

[54] METHOD OF PRODUCING PHASE SHIFTING MASK

[75] Inventor: Chien-Chao Huang, Kaohsiung, Taiwan

[73] Assignee: United Microelectronics Corp., Hsinchu, Taiwan

[21] Appl. No.: 09/095,406

[22] Filed: Jun. 10, 1998

[30]       Foreign Application Priority Data

Apr. 27, 1998 [TW] Taiwan ................................. 87106423

[51] Int. Cl.⁷ ....................................................... G06F 9/00

[52] U.S. Cl. ................................................................ 430/5

[58] Field of Search ................................ 430/5, 322, 323, 430/324, 394, 311

[56]       References Cited

U.S. PATENT DOCUMENTS 5,272,024  12/1993  Lin ................................................ 430/5
5,561,010  10/1996  Hanyu et al. ................................ 430/5

*Primary Examiner*—S. Rosasco

[57]       ABSTRACT

A method for producing a phase shifting mask comprising the steps of first forming a phase shifting layer capable of shifting incoming light by a 360° phase shift angle over a transparent substrate, or forming two phase shifting layers, which are each capable of shifting incoming light by a 180° phase shift angle, before carrying out the steps required to fabricate the phase shifting mask in a conventional method. With the additional phase shifting layer or layers, damage to the transparent substrate due to etching is prevented. Moreover, phase errors caused by defective regions in the phase shifting mask can be removed, easily resulting in the formation of a defect-free mask.

33 Claims, 15 Drawing Sheets

6,051,345

METHOD OF PRODUCING PHASE SHIFTING MASK

CROSS-REFERENCE TO RELATED APPLICATION

This application claims the priority benefit of Taiwan application Ser. No. 87106423, filed Apr. 27, 1998, the full disclosure of which is incorporated herein by reference.

BACKGROUND OF THE INVENTION

1. Field of Invention

The present invention relates to a photolithographic processing method. More particularly, the present invention relates to a method of producing a phase shifting mask (PSM).

2. Description of Related Art

As the level of device integration increases, high-resolution masks in photolithographic processing are needed in the production of semiconductor devices having the dimensions required in semiconductor fabrication. One method of increasing the resolution of masks used in photolithographic processing is to use a light source having a shorter wavelength. For example, deep ultra-violet light, having a wavelength of 2480 Å, can be generated by a krypton fluoride laser and used as a light source for photolithographic exposure. Although shortening the wavelength does increase the resolution of photolithographic processing, the depth of focus (DOF) of the devices may be insufficient, thus compromising the quality of products. Another method of increasing, resolution, actively being researched by semiconductor manufacturers, is the use of a phase shifting mask.

In principal, a phase shifting mask is a conventional photomask with an added phase shifting layer. Through positive and negative interference generated by the phase shifting layer during light exposure, an image pattern projected onto the wafer by the light projector will have a higher resolution. The biggest advantage of using the phase shifting mask is its capacity for increasing the resolution of the projector without having to use a new light source. This means that the modification is entirely in the photomask. Hence, a higher level of device integration can be achieved with the existing projector equipment.

FIGS. 1A, 2A and 3A are cross-sectional views showing three types of conventional phase shifting masks (PSMs). FIG. 1A is a cross-sectional view showing one type of conventional alternating PSM. The alternating PSM is suitable for producing line patterns for semiconductor devices on a wafer. The alternating PSM has a transparent substrate 100 made of quartz and has a chromium layer plated on top of the transparent substrate 100 that acts as a masking layer 102. Moreover, a phase shifting layer 104 made of molybdenum silicon oxynitride ($MoSi_zO_xN_y$), which generates a phase shift angle of 180° in incoming light, is formed above the transparent substrate 100 as well. Since the phase shifting layer 104 is placed in alternating positions, light shining on the phase shifting mask generates phase shift angles of 0° and 180° alternately. Therefore, light intensity resulting from diffraction is cancelled, producing a zero-point light magnitude and increasing photolithographic resolution.

FIG. 2A is a cross-sectional view showing a conventional half-tone phase shift mask (HTPSM). Normally, a HTPSM, which has a larger depth of focus, is used to produce hole patterns for semiconductor devices on a wafer. The light transparency of this photomask is roughly between 3–10%. A phase shifting layer 204, which can generate a 180° phase shift in incoming light, can be formed on portions of a transparent substrate 200 so that hole patterns can be formed on the exposed transparent substrate area 206. The HTPSM operates by shifting incoming light through phase angles of 20° and 180° alternately. Consequently, the magnitude of light at the junction of the hole pattern 206 and the phase shift layer 204 cancel each other, producing zero-point light magnitude. Hence, both contrast and resolution during light exposure can be increased.

FIG. 3A is a cross-sectional view showing a conventional rim phase shifting mask. The rim phase shifting mask is formed by depositing a phase shifting layer 304 over a transparent substrate 300 outside the region where the desired semiconductor device patterns, area 306, are formed. Through the generation of a zero point light magnitude due to interference, the resolution of photolithographic processing can be increased. As shown in FIG. 3A, the phase shifting layer 304 is sandwiched between a masking layer 302 and the transparent substrate 300. Furthermore, the masking layer 302 covers only a portion of the underlying phase shifting layer 304 while exposing a strip of phase shifting layer 304 above the transparent substrate 300 in order to increase the resolution.

However, all of these three phase shift masks face the same types of problems. Due to difficulties in controlling the etching conditions, the transparent substrate (quartz) is often damaged when the masking layer or the phase shifting layer is patterned, thereby forming defects as shown in region 150 in FIGS. 1A, 2A and 3A. Thickness of material is one of the critical factors that can seriously affect the phase shift angle of the photomask. At present, repair stations still do not have the capacity to repair the defective regions 150 by depositing a filler layer. A repair station can at most etch away a portion of the material in the defective region 150 so that phase shift errors in that portion can be removed.

In the conventional etching-repair method, the damaged transparent substrate is etched to a certain depth. By adjusting the depth of etch, the etched transparent substrate region is able to maintain the same relative phase angle difference as its adjacent pattern. For example, FIGS. 1B, 2B and 3B show the formerly defective regions 150 in areas 106, 206 and 306 of FIGS. 1A, 2A and 3A, respectively etched to form trenches 180 having a 360° phase angle shift. However, due to difficulties in controlling the etching rate and the in-line monitoring facilities, etching a trench to a depth that can produce a 360° phase shift angle is difficult. In the worst cases, the defective region 150 may be damaged beyond repair and the whole photomask then has to be thrown away.

In light of the foregoing, there is a need to provide an improved method of producing phase shifting masks.

SUMMARY OF THE INVENTION

Accordingly, the object of the present invention is to provide a method of producing a phase shifting mask capable of preventing damages to its transparent substrate and removing phase errors once defective regions on a phase shifting mask are formed so that the mask becomes defect-free.

To achieve these and other advantages and in accordance with the purpose of the invention, as embodied and broadly described herein, the invention provides a method for producing a phase shifting mask. The phase shifting mask is formed by first coating a phase shifting layer, which is capable of shifting the phase of incoming light by 360° (a 360° phase shifting layer), over a transparent substrate.

Then, a masking layer or another layer capable of shifting the phase of incoming light by 180° (a 180° phase shifting layer) is formed over the 360° phase shifting layer by a conventional method. One characteristic of this invention is that if the exposed 360° phase shifting layer is damaged when the masking layer or the phase shifting layer is etched to form the required pattern, a repairing station having the capacity to distinguish between different materials can be used to remove the damaged 360° phase shifting layer quite easily. In other words, the damaged 360° phase shifting layer can be etched away to form a defect-free mask by using the transparent substrate as an etching stop layer.

In another aspect, this invention provides a method for producing a second type of phase shifting mask. This second phase shifting mask is formed by sequentially coating a first phase shifting layer and then a second phase shifting layer over a transparent substrate. Both the first phase shifting layer and the second phase shifting layer generate a phase shift angle of 180° in incoming light, but they are made from different materials. Subsequently, a third phase shifting layer, also capable of making a 180° phase shift in incoming light, but made from a different material than the second phase shifting layer, is formed over the second phase shifting layer. Then, a masking layer is formed over the third phase shifting layer.

One characteristic of this invention is that once the defective regions are detected, whether defective regions are formed in the exposed third phase shifting layer or the second phase shifting layer when the masking layer or the third phase shifting layer are etched, a repair station can etch away the damaged layer as well as the phase shifting layer directly below it, so that the remaining phase shifting layer is able to reproduce the original phase relationship. In other words, when the masking layer is etched to form a pattern, if the exposed region of the third phase shifting layer is damaged by etching, the third phase shifting layer and the second phase shifting layer can be removed by a repair station, using the first phase shifting layer as an etching stop layer. On the other hand, if the exposed region of the second phase shifting layer is damaged by etching when the third phase shifting layer is etched to form a pattern, the second phase shifting layer and the first phase shifting layer can be removed by a repair station using the transparent substrate as an etching stop layer. In both cases, the remaining phase shifting layers are able to produce the correct phase relationship.

According to the preferred embodiment of this invention, the second type of phase shifting mask can be used in both alternating phase shifting masks and rim phase shifting masks. Furthermore, detection of damages can be carried out after the respective patterning of the masking layer and the third phase shifting layer. However, method of production and repairs are slightly different depending on the type of phase shifting mask to be manufactured.

In producing an alternating phase shifting mask, the portion of the third phase shifting layer that is to be one of the light-passing regions has to be removed when the phase shifting layer is patterned, after the first damage detection and repair. Furthermore, if the first phase shifting layer exposed after the first repair is to be one of the light passing regions, then the first phase shifting layer in that region has to be removed simultaneously in order to expose the transparent substrate. Hence, if the third phase shifting layer and the first phase shifting layer both have the same etching rate, the third phase shifting layer and the first phase shifting layer can be removed in the same etching operation.

In producing a rim phase shifting mask, portions of the third phase shifting layer that are to be one of the light passing regions have to be removed when patterning the phase shifting layer after the first damage detection and repair operation. Furthermore, portions of the first phase shifting layer exposed after the first detection and repair operation must be simultaneously removed. Therefore, if the third phase shifting layer and the first phase shifting layer both have the same etching rate, the third phase shifting layer and the first phase shifting layer can be removed in the same etching operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
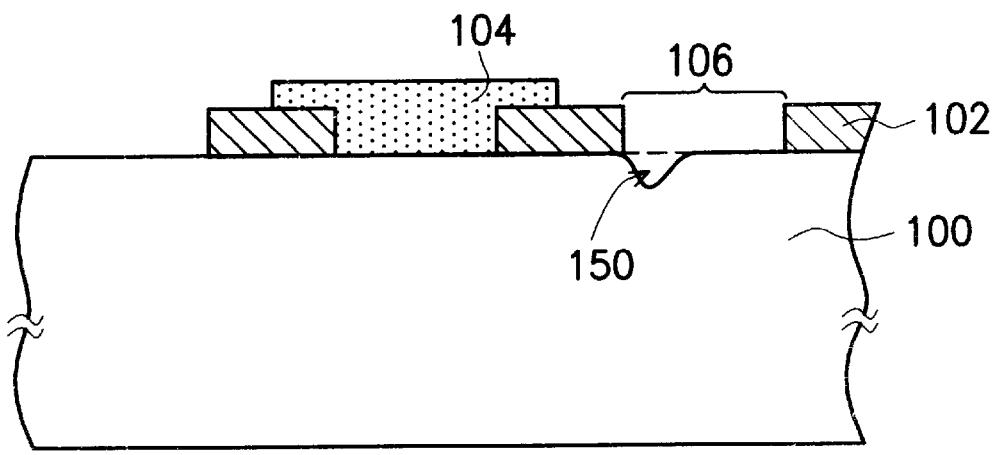
FIGS. 1A and 1B are cross-sectional views showing a conventional alternating phase shifting mask and the same phase shifting mask after a repair operation.
Figure 1B:
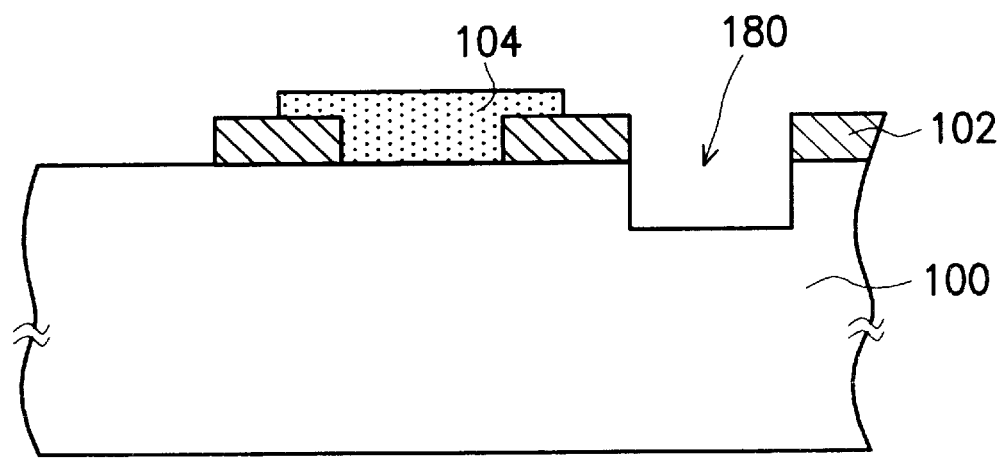
Figure 2A:
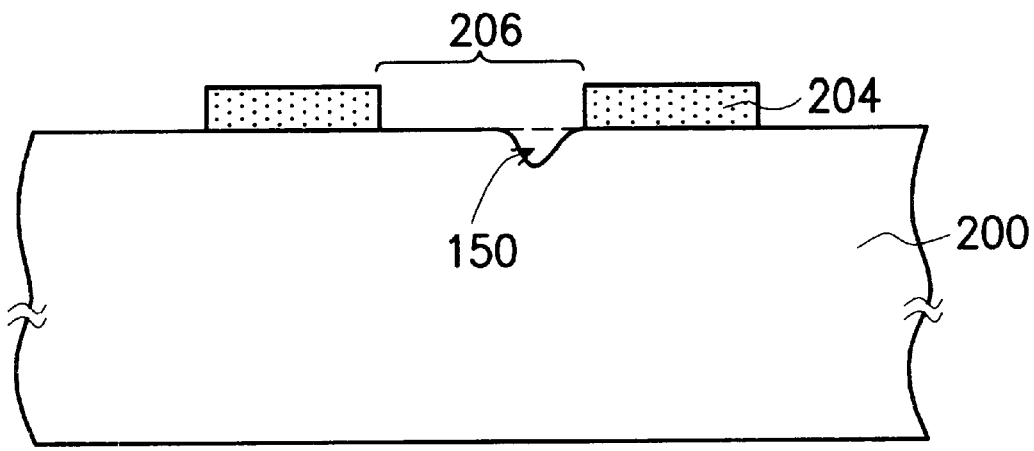
FIGS. 2A and 2B are cross-sectional views showing a conventional half-tone phase shifting mask and the same phase shifting mask after a repair operation.
Figure 2B:
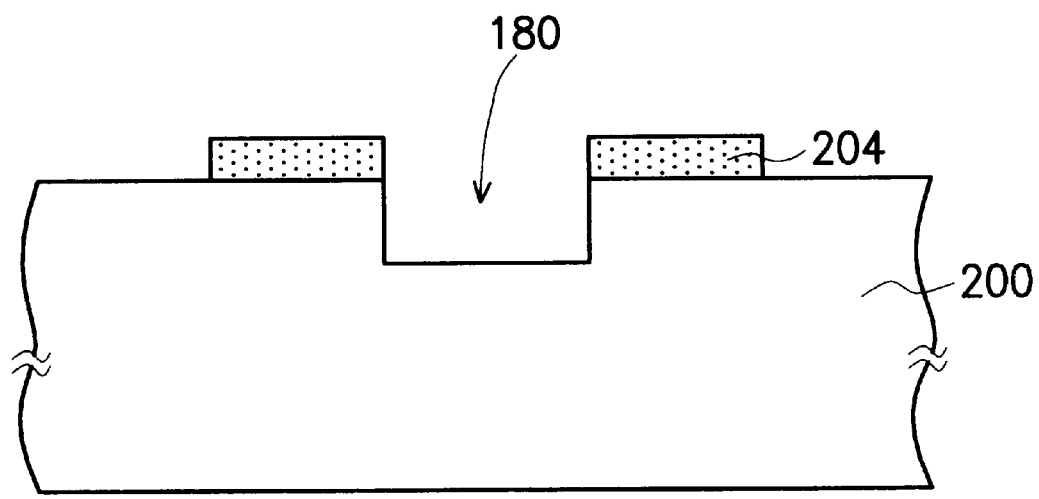
Figure 3A:
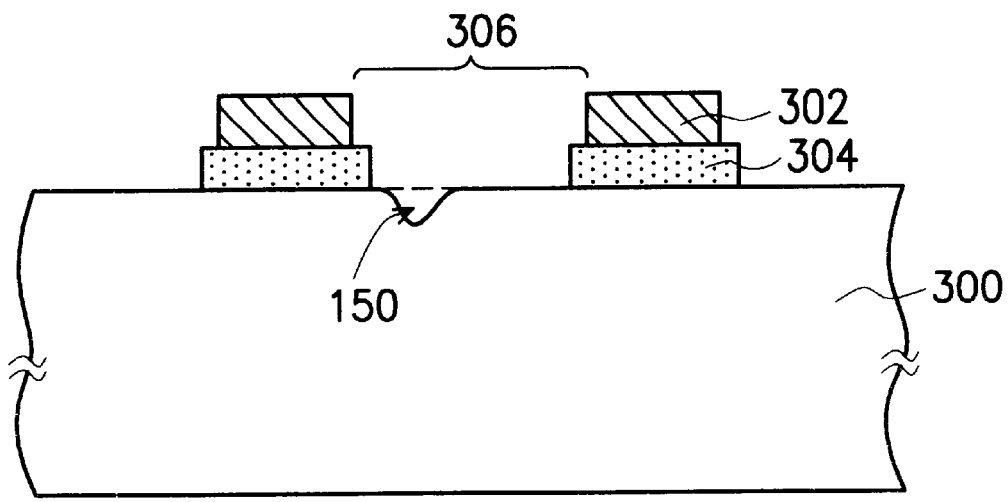
FIGS. 3A and 3B are cross-sectional views showing a conventional rim phase shifting mask and the same phase shifting mask after a repair operation.
Figure 3B:
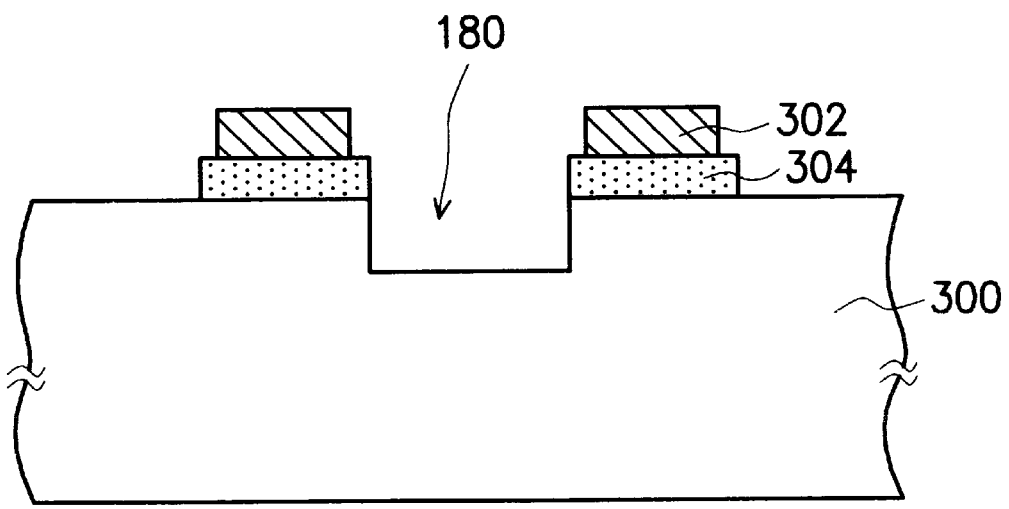

Reference will now be made in detail to the present preferred embodiments of the invention, examples of which are illustrated in the accompanying drawings. Wherever possible, the same reference numbers are used in the drawings and the description to refer to the same or like parts.

To achieve these and other advantages and in accordance with the purpose of the invention, the invention provides a method for producing a phase shifting mask. The phase shifting mask is formed by first coating a phase shifting layer capable of shifting the phase of incoming light by 360° (a 360° phase shifting layer) over a transparent substrate. Then, a masking layer or another layer capable of shifting the phase of incoming light by 180° (a 180° phase shifting layer) is formed over the 360° phase shifting layer using a conventional method. If the exposed 360° phase shifting layer is damaged when the masking layer or the phase shifting layer is etched to form a pattern,, a repair station having the capacity to detect signals from different material layers can be used to remove the damaged 360° phase shifting layer. In other words, the damaged 360° phase shifting layer can be etched away to form a defect-free mask using the transparent substrate as an etching stop layer.

Figure 4A:
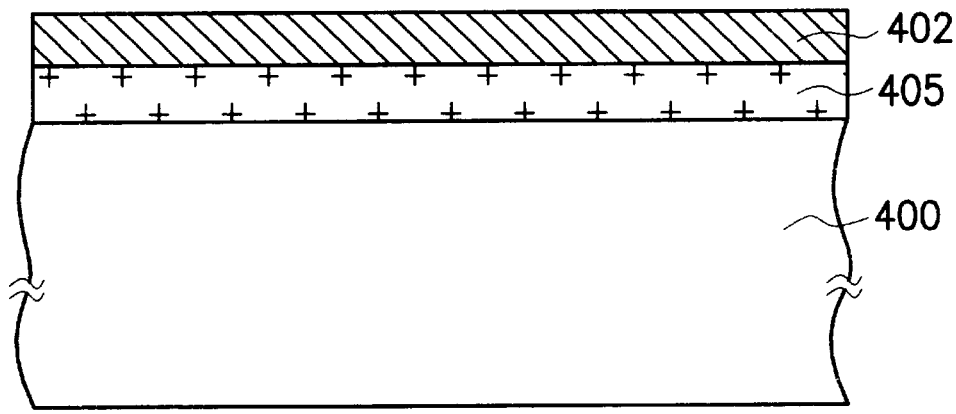
FIGS. 4A through 4D are cross-sectional views showing the progression of manufacturing steps taken to produce an alternating phase shifting mask according to a first preferred embodiment of this invention.

FIGS. 4A through 4D are cross-sectional views showing the progression of manufacturing steps taken to produce an alternating phase shifting mask according to a first preferred embodiment of this invention. First, as shown in FIG. 4A, a 360° phase shifting layer 405 is deposited over a transparent substrate 400 such as glass or quartz. Next, a masking layer 402 is formed over the phase shifting layer 405. The phase shifting layer can be made, for example, from silicon oxynitride ($SiO_XN_Y$) or molybdenum silicon oxynitride ($MoSi_ZO_XN_Y$), and the masking layer 402 can be made from material such as chromium.

Figure 4B:
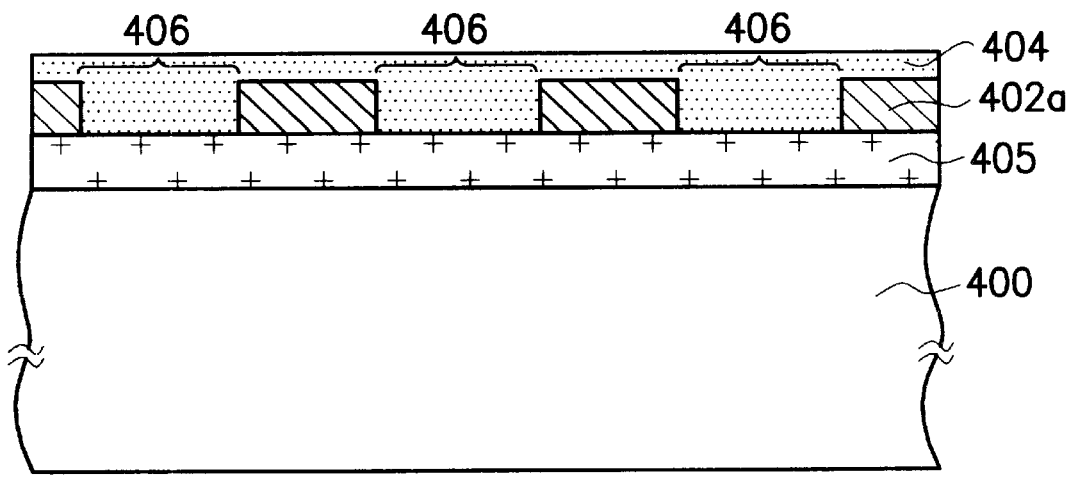

Next, as shown in FIG. 4B, the masking layer 402 is patterned to expose a portion of the phase shifting layer 405 and form a plurality of exposed regions 406. The masking layers 402a remaining on the phase shifting layer 405 form the mask region of the alternating phase shifting mask. Thereafter, a 180° phase shifting layer 404 is formed over the transparent substrate 400 covering the masking layer 402a and the exposed regions 406. The phase shifting layer 404 has to be made from a material that differs from the phase shifting layer 405, such as molybdenum silicon oxynitride ($MoSi_ZO_XN_Y$) or silicon oxynitride ($SiO_XN_Y$), before the phase shifting layer 402 can serve as an etching stop layer in subsequent patterning of the phase shifting layer 404.

Figure 4C:
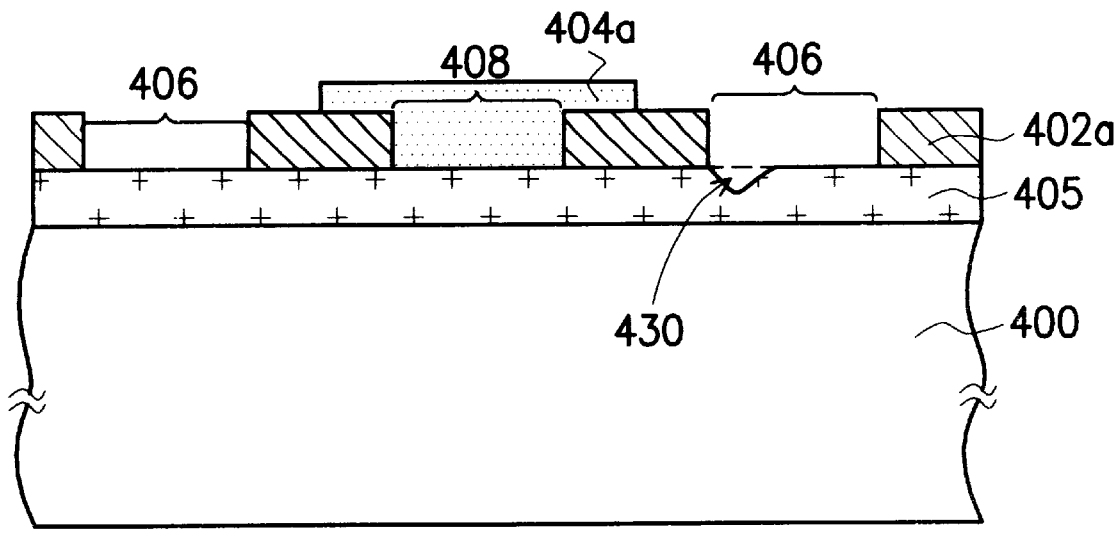

Next, as shown in FIG. 4C, the phase shifting layer 404 is patterned to expose a portion of the exposed regions 406. The remaining phase shifting layer 404a becomes the phase shifting region 408 of the alternating phase shifting mask, and the exposed regions 406 become the light passing regions of the alternating phase shifting mask.

Figure 4D:
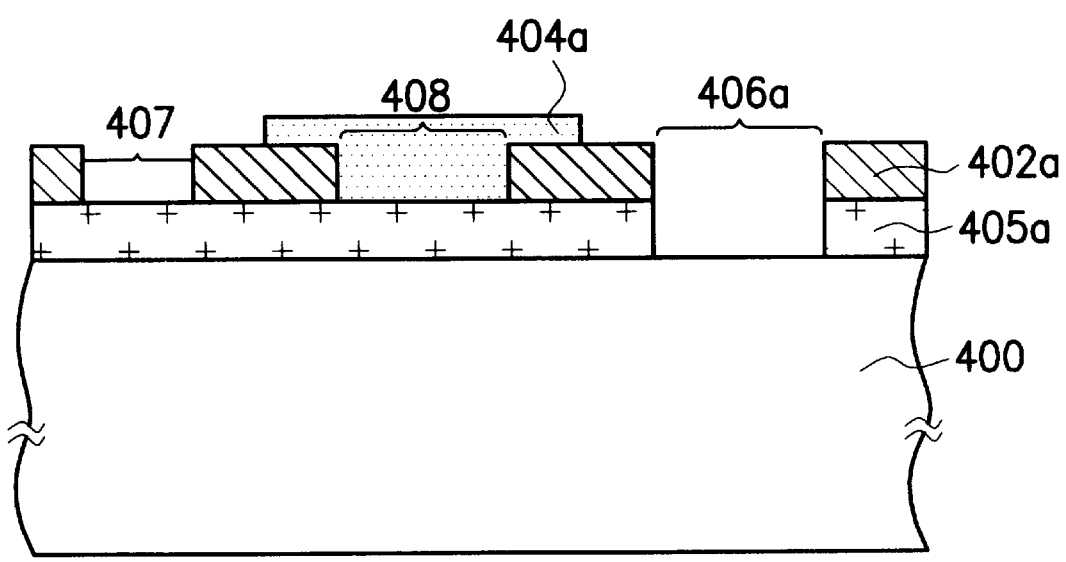

Thereafter, as shown in FIG. 4D, a damage detection and repair operation is carried out. If defective regions 430 are formed in the exposed region 406 when the masking layer 402 or the phase shifting layer 404 is etched, the phase shifting layer 405 in the defective regions 430 can be removed using a repair station. The phase shifting layer 405 in the defective regions can be etched away using the transparent substrate 400 as an etching stop layer. Finally, a portion of the transparent substrate 400 is exposed to form another exposed region 406a.

Hence, the phase shifting region 408 of the photomask is formed by the combination of the 180° phase shifting layer 404a together with the 360° phase shifting layer 405a, and the light passing region is the phase shifting layer 405a in the exposed region 406 or the transparent substrate 400 in the exposed region 406a. Therefore, whether light from a light source passes through the exposed region 406 or the exposed region 406a, the light still manages to interact with the 180° phase-shifted light that passes through the phase shifting region 408 and produce alternately distributed phase angle shifts of 0° and 180°. Consequently, negative and positive interference is achieved and, as a result, resolution can be increased.

Figure 5A:
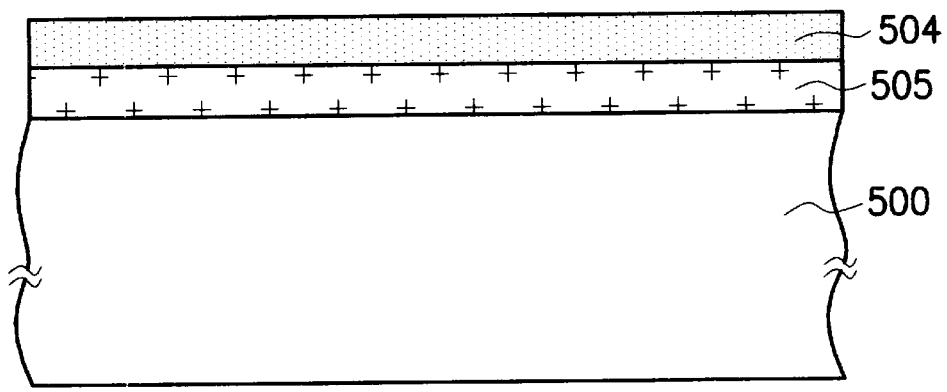
FIGS. 5A through 5C are cross-sectional views showing the progression of manufacturing steps taken to produce a half-tone phase shifting mask according to a first preferred embodiment of this invention.
Figure 5B:
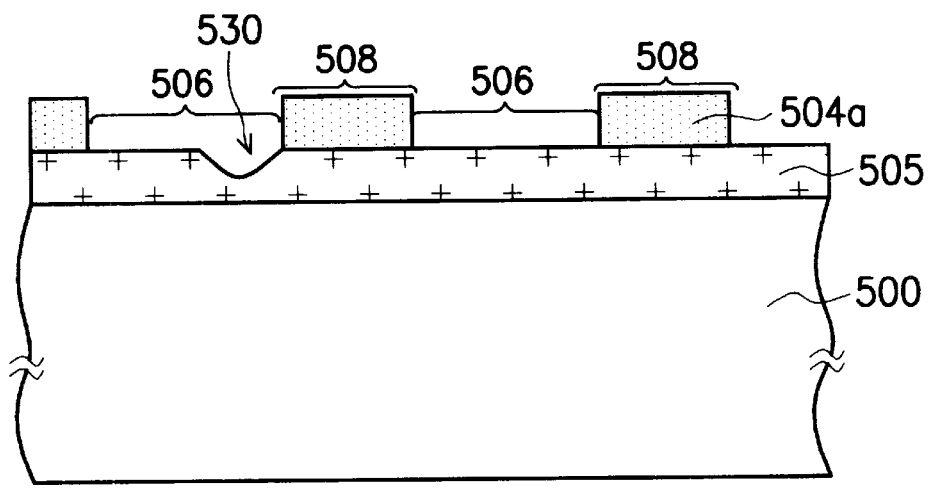
Figure 5C:
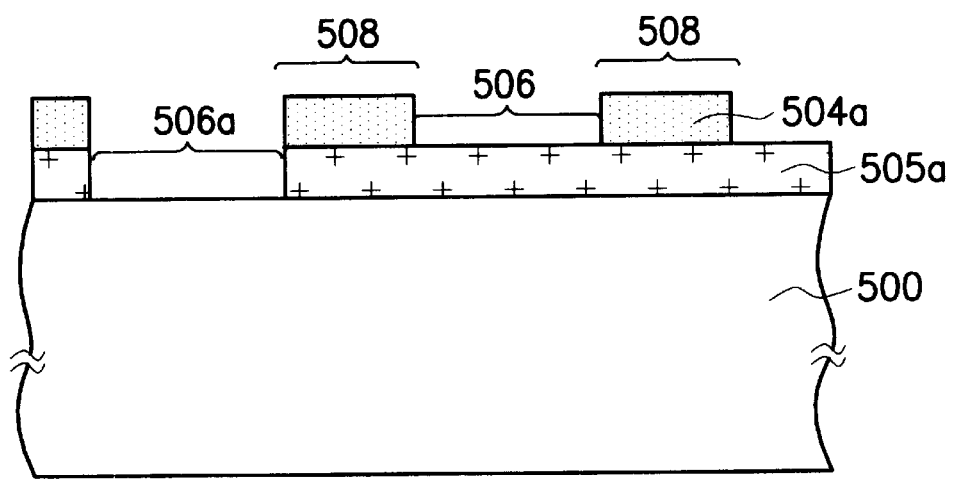

FIGS. 5A through 5C are cross-sectional views showing the progression of manufacturing steps taken to produce a half-tone phase shifting mask according to a first preferred embodiment of this invention. First, as shown in FIG. 5A, a 360° phase shifting layer 505 is deposited over a transparent substrate 500. Next, a 180° phase shifting layer 504 is formed over the phase shifting layer 505. The 360° phase shifting layer 505 and the 180° phase shifting layer 504 are made from different materials including, for example, molybdenum silicon oxynitride ($MoSi_ZO_XN_Y$) or silicon oxynitride ($SiO_XN_Y$).

Next, as shown in FIG. 5B, a conventional method is used to pattern the phase shifting layer 504, exposing a portion of the phase shifting layer 505 and forming a plurality of exposed regions 506. The phase shifting layer 504a remaining on the phase shifting layer 505 forms phase shifting regions 508.

Thereafter, as shown in FIG. 5C, a damage detection and repair operation is carried out. If defective regions 530 are formed in the exposed region 506 when the phase shifting layer 504 is etched, the phase shifting layer 505 in the defective regions 530 can be removed by a repair station. The phase shifting layer 505 in the defective regions 530 can be etched away using the transparent substrate 500 as an etching stop layer. Finally, a portion of the transparent substrate 500 is exposed forming another exposed region 506a.

In the above description of half-tone phase shifting mask production, the phase shifting region 508 is formed by the combination of the 180° phase shifting layer 504a together with the 360° phase shifting layer 505a, and the light passing region is the phase shifting layer 505a in the exposed region 506 or the transparent substrate 500 in the exposed region 506a. Therefore, whether light from a light source passes through the exposed regions 506 or the exposed regions 506a, the light still manages to interact with the 180° phase-shifted light that passes through the phase shifting region 508. Consequently, negative and positive interference is achieved and, as a result, resolution can be increased.

Figure 6A:
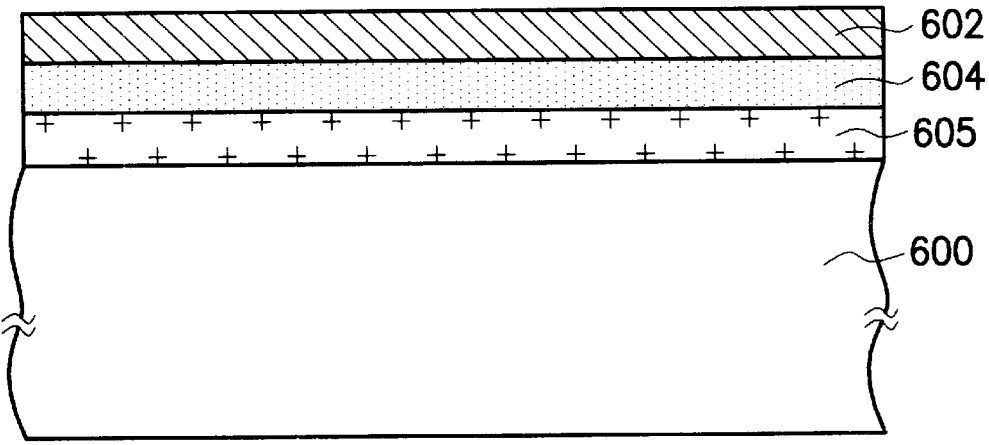
FIGS. 6A through 6C are cross-sectional views showing the progression of manufacturing steps taken to produce a rim phase shifting mask according to a first preferred embodiment of this invention.
Figure 6B:
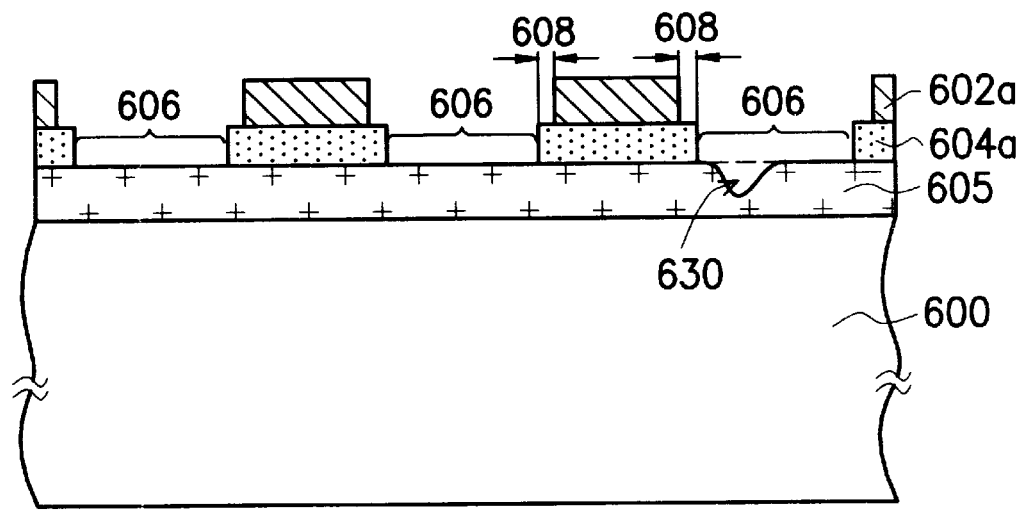
Figure 6C:
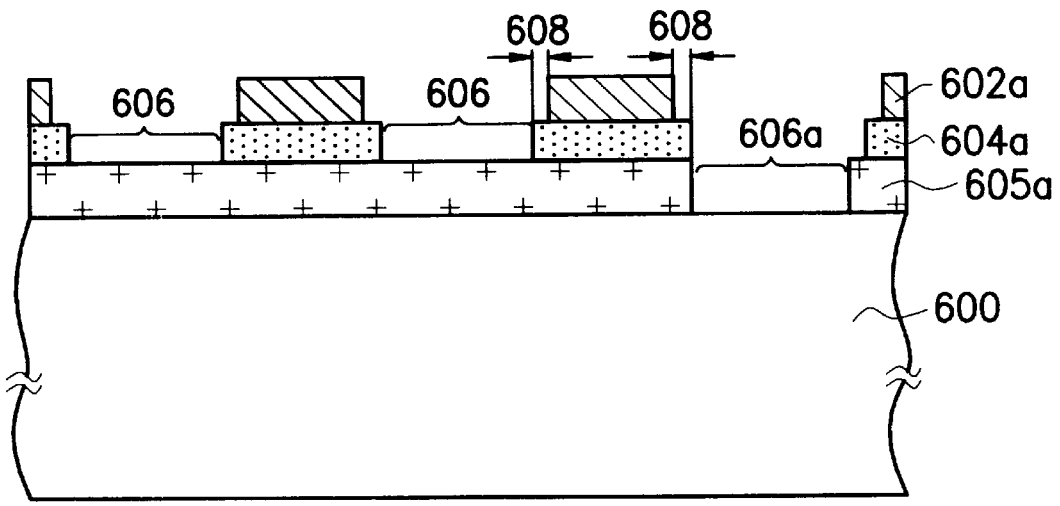

FIGS. 6A through 6C are cross-sectional views showing the progression of manufacturing steps taken to produce a rim phase shifting mask according to a first preferred embodiment of this invention. First, as shown in FIG. 6A, a 360° phase shifting layer 605 is deposited over a transparent substrate 600. Next, a 180° phase shifting layer 604 and a masking layer 602 are sequentially formed over the phase shifting layer 605. The 360° phase shifting layer 605 and the 180° phase shifting layer 604 are made from different materials.

Next, as shown in FIG. 6B, the masking layer 602 and the phase shifting layer 604 are patterned to expose a portion of the phase shifting layer 604a and form a plurality of phase shifting regions 608. Furthermore, portions of the phase shifting layer 605 are exposed to form a plurality of exposed regions 606.

Thereafter, as shown in FIG. 6C, a damage detection and repair operation is carried out. If defective regions 630 are formed in the exposed region 606 when the phase shifting layer 604 is etched, the phase shifting layer 605 in the defective regions 630 can be removed by a repair station. The phase shifting layer 605 in the defective regions 630 can be etched away using the transparent substrate 600 as an etching stop layer. Finally, a portion of the transparent substrate 600 is exposed forming another exposed region 606a.

In the above description of rim phase shifting, mask production, the phase shifting region 608 is formed by the combination of the 180° phase shifting layer 604a together with the 360° phase shifting, layer 605a, and the light passing region is the phase shifting layer 605a in the exposed region 606 or the transparent substrate 600 in the exposed region 606a. Therefore, whether light from a light source passes through the exposed regions 606 or the exposed regions 606a, the light still manages to interact with the 180° phase-shifted light that passes through the phase shifting region 608. Consequently, negative and positive interference is achieved and, as a result, resolution can be increased.

Figure 7A:
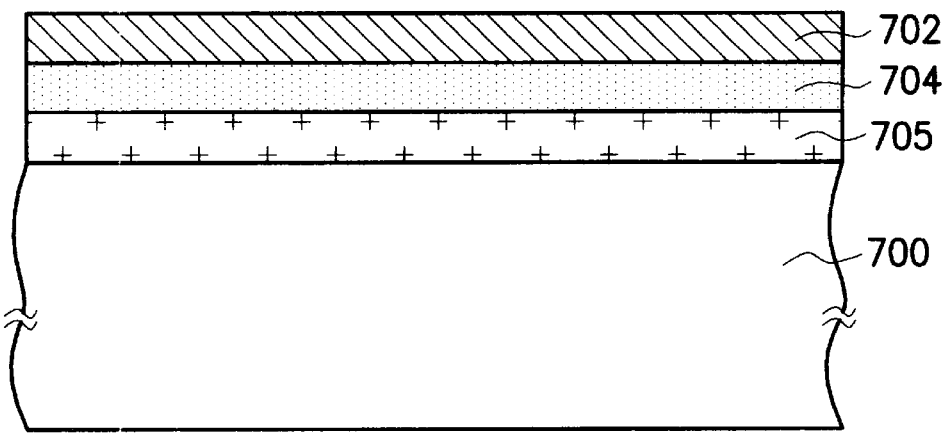
FIGS. 7A through 7C are cross-sectional views showing the progression of manufacturing steps taken to produce a second alternating phase shifting mask according to a first preferred embodiment of this invention.
Figure 7B:
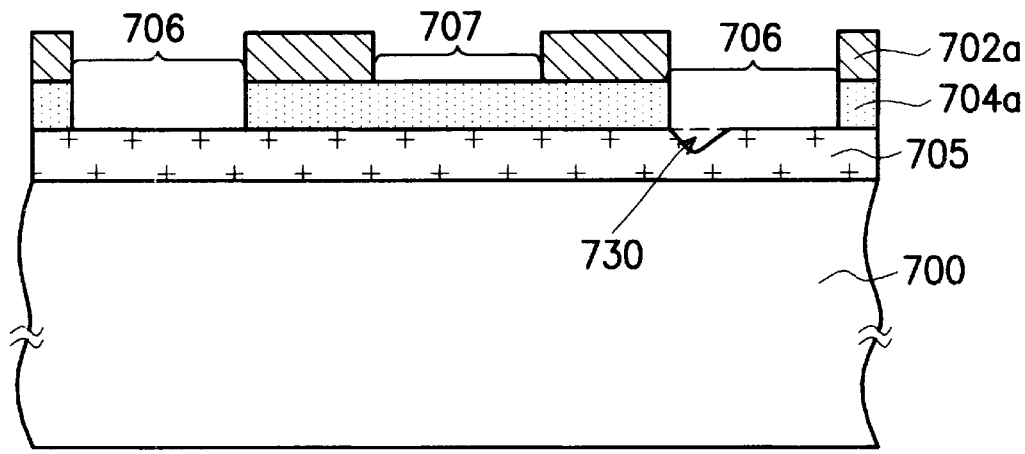
Figure 7C:
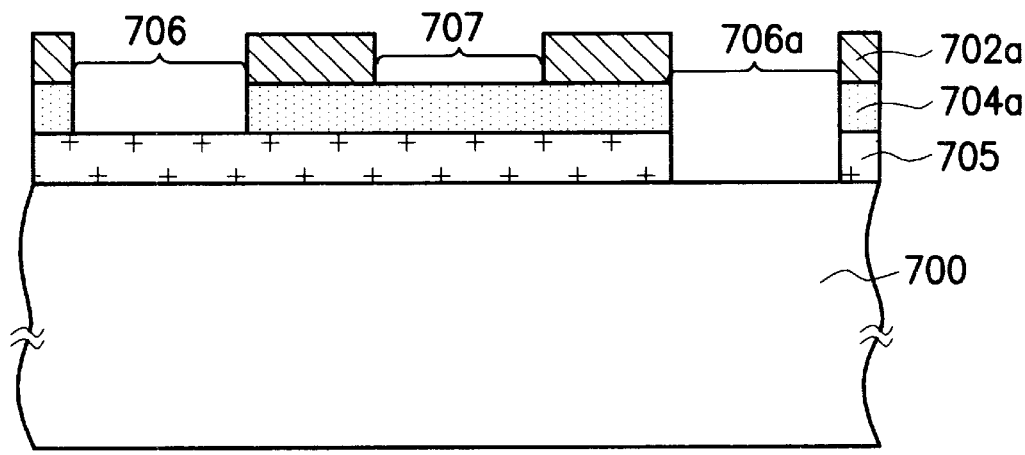

FIGS. 7A through 7C are cross-sectional views showing the progression of manufacturing steps taken to produce a second alternating phase shifting mask according to a first preferred embodiment of this invention. First, as shown in FIG. 7A, a 360° phase shifting layer 705 is deposited over a transparent substrate 700 such as glass or quartz. Next, a 180° phase shifting, layer 704 and a maskingy layer 702 are sequentially formed over the phase shifting, layer 705. The 360° phase shifting layer 705 and the 180° phase shifting, layer 704 are made from different materials, for example, silicon oxynitride ($SiO_xN_y$) or molybdenum silicon oxynitride ($MoSi_zO_xN_y$), and the masking layer 702 can be made from material such as chromium.

Next, as shown in FIG. 7B, the masking layer 702 and the phase shifting layer 704 are patterned to expose portions of the phase shifting layer 705 and form a plurality of exposed regions 706. The portions of masking layer 702a remaining on the phase shifting layer 704a form the masking region of the alternating phase shift mask, and the regions exposing the phase shifting layer 704a become the phase shifting regions 707.

Thereafter, as shown in FIG. 7C, a damage detection and repair operation is carried out. If defective regions 730 are formed in the exposed phase shifting layer 705 when the masking layer 702 or the phase shifting layer 704 is etched, the phase shifting layer 705 in the defective regions 730 can be removed by a repair station. The phase shifting layer 705 in the defective regions 730 can be etched away using the transparent substrate 700 as an etching stop layer. Finally, a portion of the transparent substrate 700 is exposed to form another exposed region 706a.

In the above description of fabrication of the second alternating phase shifting mask, the phase shifting region 707 is formed by the combination of the 180° phase shifting layer 704a together with the 360° phase shifting layer 705, and the light passing region is the phase shifting layer 705 in the exposed region 706 or the transparent substrate 700 in the exposed regions 706a. Therefore, whether light from a light source passes through the exposed region 706 or the exposed region 706a, the light still manages to interact with the 180° phase-shifted light that passes through the phase shifting region 707 and produces alternately distributed phase angle shifts of 0° and 180°. Consequently, negative and positive interference is achieved, and resolution can be increased.

To facilitate the repair of a phase shifting mask, a second preferred embodiment for producing a phase shifting mask is provided. The phase shifting mask is formed by sequentially forming three 180° phase shifting layers over a transparent substrate. The middle phase shifting layer is made from a material different from its upper and lower phase shifting counterparts. Next, a masking layer is formed over the upper phase shifting layer, and then the masking layer and the upper phase shifting layer are patterned. Damage detection and repair can be conducted after both the masking layer and the upper phase shifting layer are patterned. Alternatively, the damage detection and repair can be carried out immediately after each patterning operation. The methods are explained more fully in the following paragraphs.

Figure 8A:
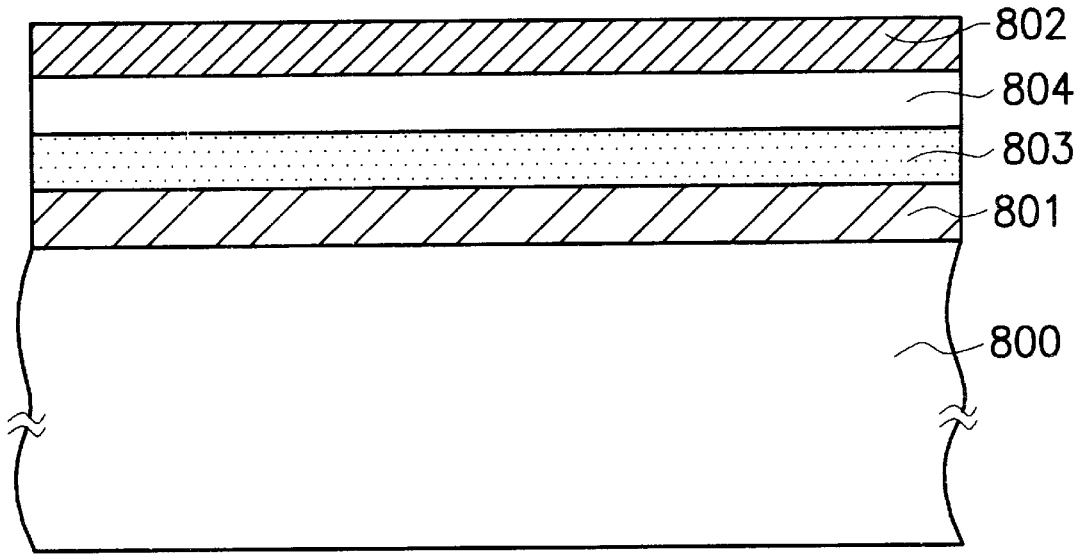
FIGS. 8A through 8D are cross-sectional views showing the progression of manufacturing steps taken to produce an alternating phase shifting mask according to a second preferred embodiment of this invention.

FIGS. 8A through 8D are cross-sectional views showing the progression of manufacturing steps taken to produce an alternating phase shifting mask according to a second preferred embodiment of this invention. Damage detection and repair are conducted after patterning of the masking layer and the upper phase shifting layer is complete. First, as shown in FIG. 8A, a first 180° phase shifting layer 801 and then a second 180° phase shifting layer 803 are formed over a transparent substrate 800. The first and the second 180° phase shifting layers are made from different materials. Next, a third 180° phase shifting layer 804 and then a masking layer 802 are formed over the second phase shifting layer 803. The third and the second 180° phase shifting layers are again made from different materials. Materials for forming the first, second and third phase shifting layers 801, 803 and 804 include silicon oxynitride or molybdenum silicon oxynitride.

Figure 8B:
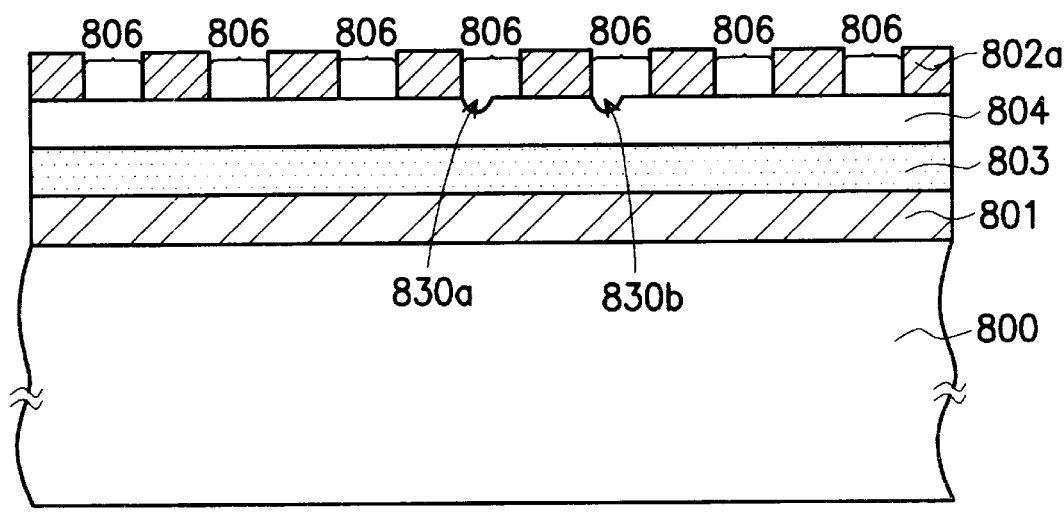

Next, as shown in FIG. 8B, the masking layer 804 is patterned to expose a portion of the phase shifting layer 804 and form a plurality of exposed regions 806. The remaining portions of masking layer 802a form the masking region of the phase shifting mask. Among the exposed regions 806, some of the exposed phase shifting layers 804 are damaged when the masking layer 802 are etched to form a pattern. These defective regions are labeled 830a and 830b in FIG. 8B.

Figure 8C:
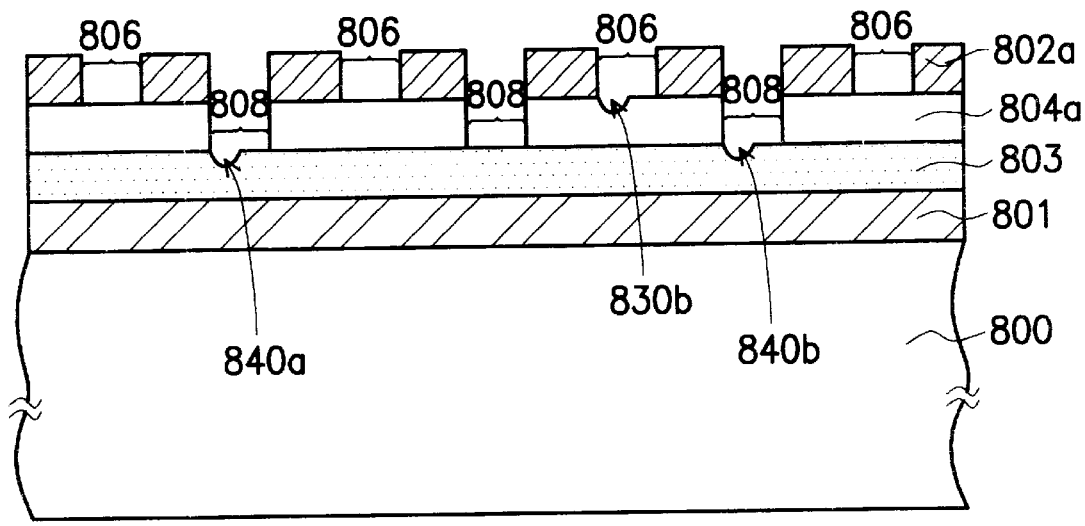

Thereafter, as shown in FIG. 8C, the phase shifting layer 804 is patterned using the phase shifting layer 803 as the etching stop layer. A portion of the phase shifting layer 804 in the exposed regions 806 is removed to expose a portion of the phase shifting layer 803 and form a plurality of exposed regions 808. The exposed regions 808 form the light passing regions of the alternating phase shifting mask, and the exposed regions 806 are able to generate a 180° phase shift of incoming light and hence become the phase shifting region. Among the exposed regions 808, some of the exposed phase shifting layers 803 are damaged when the phase shifting layer 804 are etched. These defective regions are labeled 840a and 840b in FIG. 8C. Since the defective region 830a in exposed region 806 is located in the light passing region of the phase shifting mask, the phase shifting layer 804 in the exposed region 806 has to be removed to expose the phase shifting layer 803 after the phase shifting layer 804 is patterned. However, because the defective region 830b is located in the phase shifting region of the phase shifting mask, the phase shifting layer 804a must remain. Therefore, defective region 830b will remain after the phase shifting layer 804 is patterned.

Figure 8D:
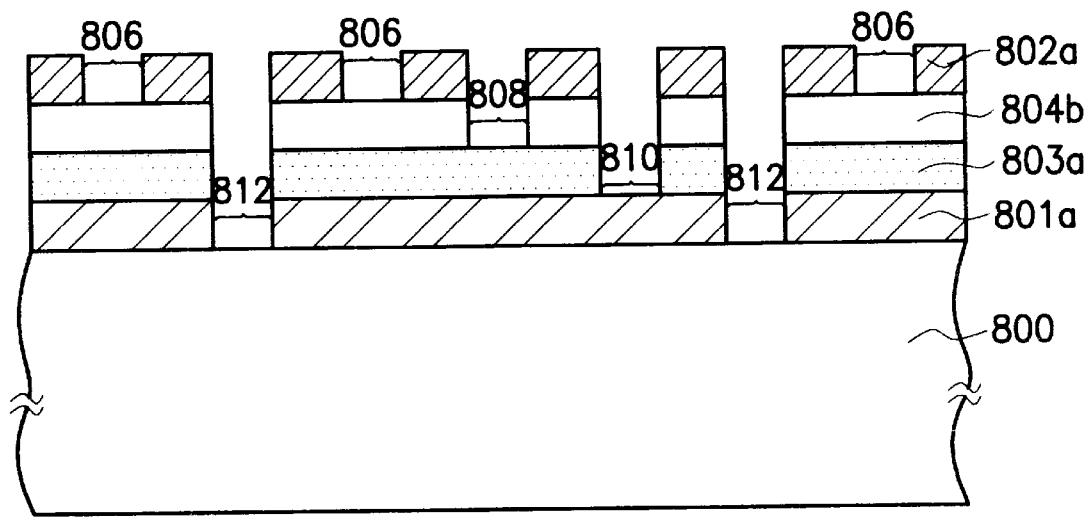

Finally, as shown in FIG. 8D, damage detection and repair are carried out. The method is to locate the defective regions 830b in the phase shifting layer 804a and the defective regions 840a and 840b in the phase shifting layer 803 by using a detecting station. Next, a repair station is used to repair the damaged phase shifting mask. Repair includes removing the exposed defective phase shifting layer and the phase shifting layer below it. By removing two phase shifting layers both having a 180° phase shifting angle, the phase shifting mask is restored to its original condition. For example, the method of repair the defective region 830b is to remove the phase shifting layer 804a in the exposed region 806 and the phase shifting layer 803 below it using the phase shifting layer 801 as an etching stop layer, thereby exposing the phase shifting layer 801 and forming an exposed region 810. The method of repairing the defective regions 840a and 840b is to remove the phase shifting layer 803 in the exposed regions 808 and the phase shifting layer 801 below it using the transparent substrate 800 as an etching stop layer, thereby exposing the transparent substrate 800 and forming exposed regions 812.

According to the above method of producing an alternating phase shifting mask, the phase shifting regions are formed from a single phase shifting layer 801a, for example, the exposed region 810. In addition, the phase shifting regions are also formed from the combination of several layers such as phase shifting layers 804b, 803a and 801a, which form, for example, the exposed region 806. The light passing regions of the phase shifting mask are the exposed transparent substrate 800 in exposed regions 812, or regions having phase shifting layers 803a and 801a, such as the exposed regions 808. Therefore, whether light from a light source passes through the exposed regions 812 or the exposed region 808, the light still manages to interact with the 180° phase-shifted light that passes through the exposed regions 806 or 810 and produce alternately distributed phase angle shifts of 0° and 180°. Consequently, negative and positive interference is achieved and, as a result, resolution can be increased.

Figure 9A:
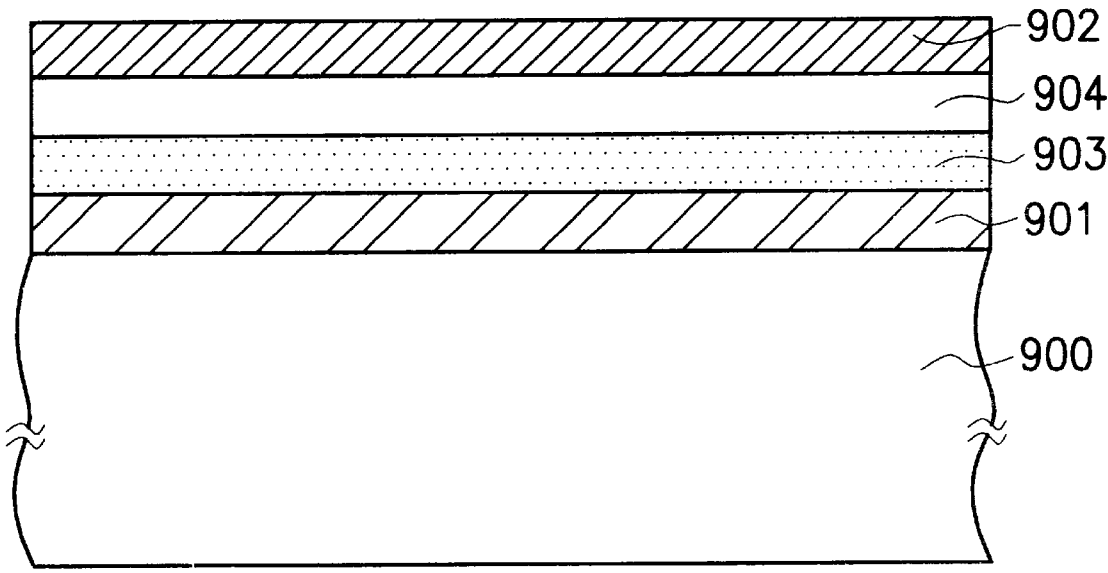
FIGS. 9A through 9E are cross-sectional views showing the progression of manufacturing steps taken to produce an alternating phase shifting mask according to a second preferred embodiment of this invention.

In the above method of producing an alternating phase shifting mask, damage detection and repair can be carried out separately after patterning the masking layer and after patterning the phase shifting layer. FIGS. 9A through 9E are cross-sectional views showing the progression of manufacturing steps taken to produce an alternating phase shifting mask according to a second preferred embodiment of this invention. First, as shown in FIG. 9A, three 180° phase shifting layers 901, 903 and 904 are formed over a transparent substrate 900. Next, a masking layer 902 is formed over the phase shifting layer 904. Preferably, the phase shifting layer 901 and the phase shifting layer 904 have the same etching rate for the same etchant so that they can be etched together in subsequent patterning of the light passing regions of the phase shifting mask.

Figure 9B:
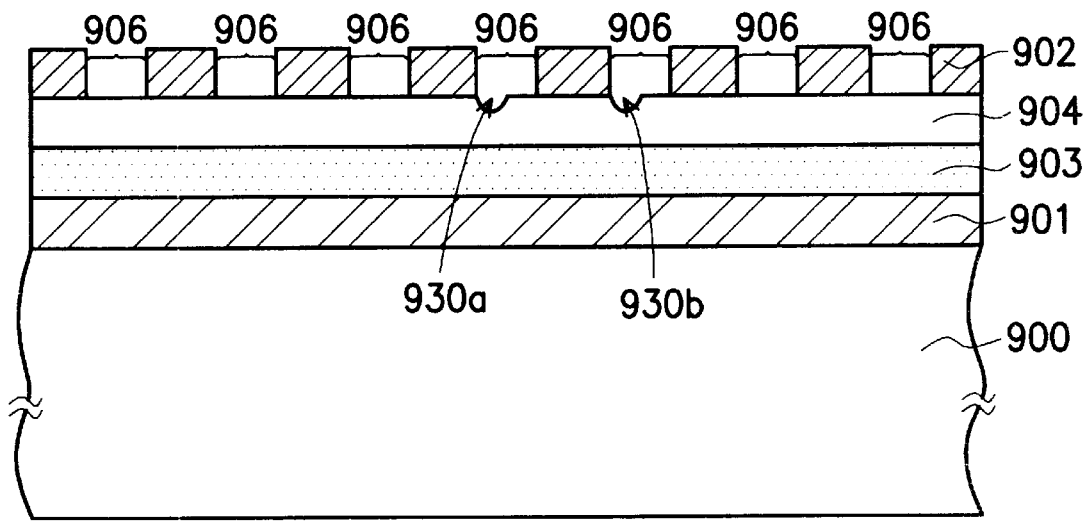

Next, as shown in FIG. 9B, the masking layer 902 is patterned to expose a portion of the phase shifting layer 904 and form a plurality of exposed regions 906. When the masking layer 902 is patterned, portions of the phase shifting layer 904 in some of the exposed regions 906 are damaged, forming defective regions 930a and 930b.

Figure 9C:
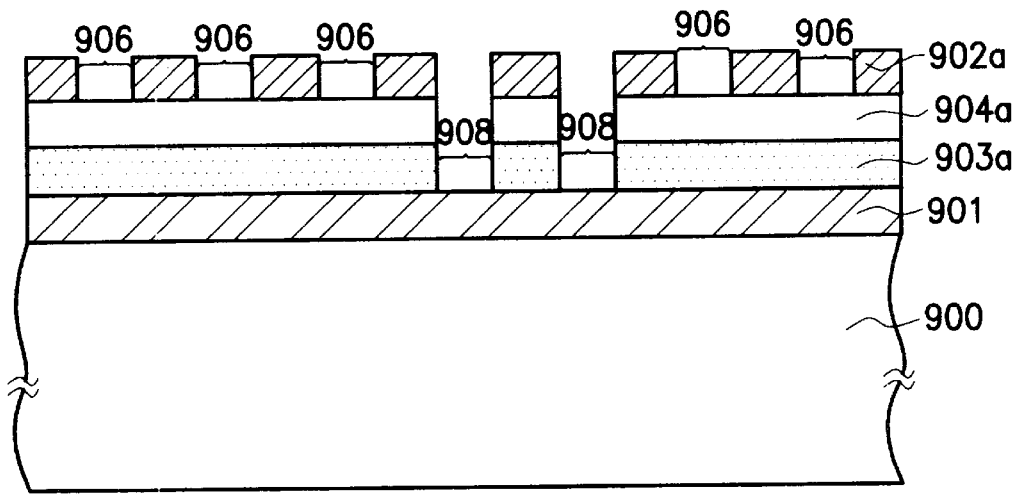

Next, as shown in FIG. 9C, damage detection and repair are conducted. First, defective regions 930a and 930b in some of the exposed regions 906 examined by a detecting station. Next, using the phase shifting layer 901 as an etching stop layer, phase shifting layer 904 and the phase shifting layer 903 below it, in the exposed defective regions 930a and 930b, are removed to expose the underlying phase shifting layer 901 and form exposed regions 908. In other words, two 180° phase shifting layers 904 and 903 are removed together so that the same phase shifting angle is obtained when light passes through the exposed regions 908.

Figure 9D:
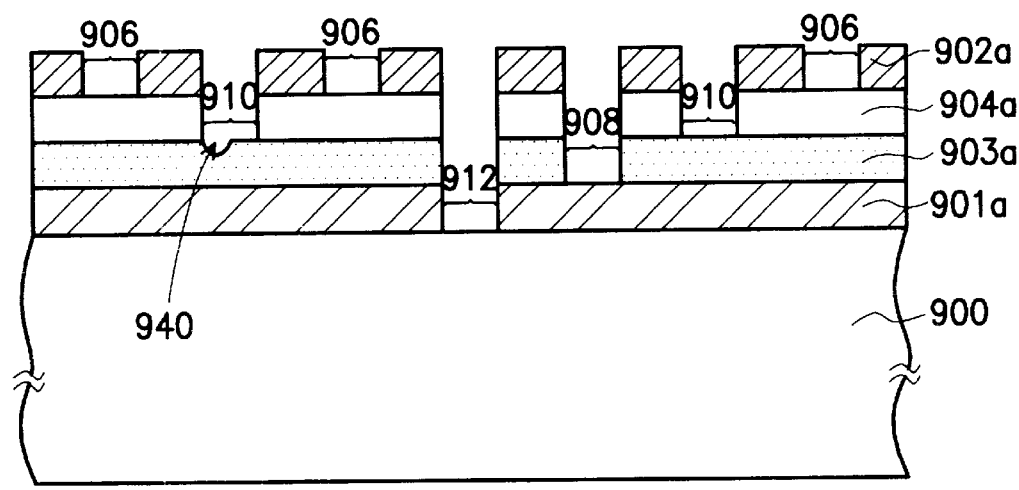

Thereafter, as shown in FIG. 9D, the light passing region of the phase shifting mask is patterned. This includes removing a portion of the phase shifting layer 904a in the exposed regions 906, thereby exposing a portion of the phase shifting layer 903a to form exposed regions 910. Next, a portion of the phase shifting layer 901 in the exposed regions 908 is removed to expose a portion of the transparent substrate 900 and form exposed regions 912. Preferably, the phase shifting layer 904a and the phase shifting layer 901 have the same etching rate so that the two phase shifting layers 904a and 901 can be etched in the same etching operation. When the phase shifting layer 904a is removed, a portion of the phase shifting layer 903a in one of the exposed region 910 is damaged, forming a defective region 940.

Figure 9E:
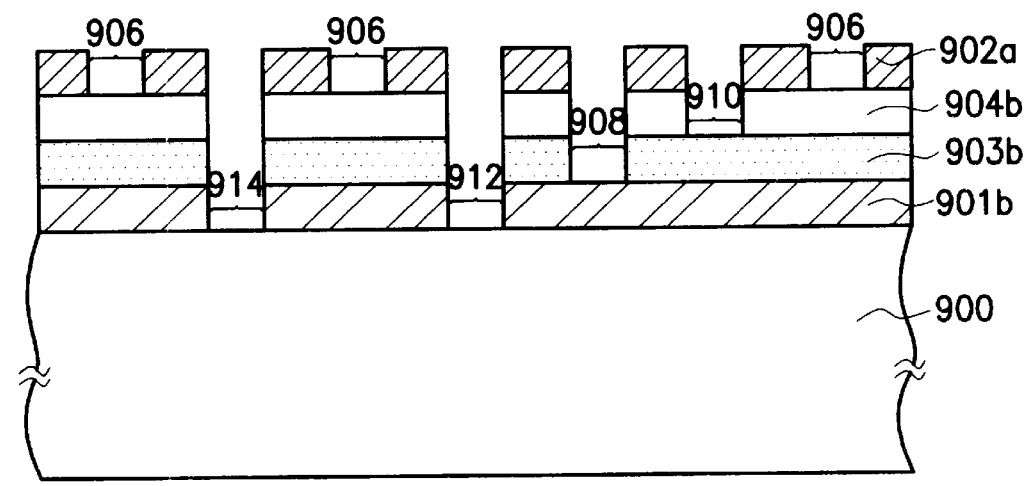

Finally, as shown in FIG. 9E, a second damage detection and repair operation is carried out. First, a defective region 940 in one of the exposed regions 910 examined by a detecting station. Next, using the transparent substrate 900 as an etching stop layer, phase shifting layer 903a and the phase shifting layer 901a below it, in the exposed defective region 940, are removed to expose the underlying transparent substrate 900 and form an exposed region 914.

According to the above method of producing an alternating phase shifting mask, the phase shifting regions are formed from a single phase shifting layer 901b, for example, the exposed region 908. In addition, the phase shifting regions can also be formed from the combination of several layers such as phase shifting layer 904b, 903b and 901b, as in the exposed region 906, for example. The light passing regions of the phase shifting mask are the exposed transparent substrate 900 in exposed regions 912 and 914, or areas having phase shifting layer 903a and 901a, such as the exposed regions 910. Therefore, whether light from a light source passes through the exposed region 912 and the exposed region 914 or through the exposed region 910, the light still manages to interact with the 180° phase-shifted light that passes through the exposed regions 906 or 908 and produce alternately distributed phase angle shifts of 0° and 180°. Consequently, negative and positive interference is achieved and resolution can be increased.

Figure 10A:
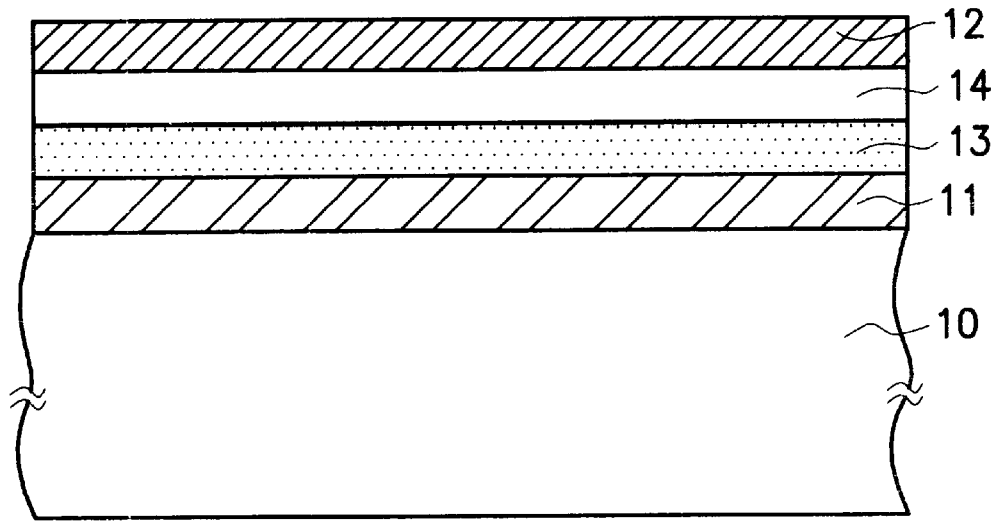
FIGS. 10A through 10E are cross-sectional views showing the progression of manufacturing steps taken to produce a rim phase shifting mask according to a second preferred embodiment of this invention.

FIGS. 10A through 10E are cross-sectional views showing the progression of manufacturing steps taken to produce a rim phase shifting mask according to a second preferred embodiment of this invention. First, as shown in FIG. 10A, three 180° phase shifting layers 11, 13 and 14 are sequentially formed over a transparent substrate 10. Next, a masking layer 12 is formed over the phase shifting layer 14.

Figure 10B:
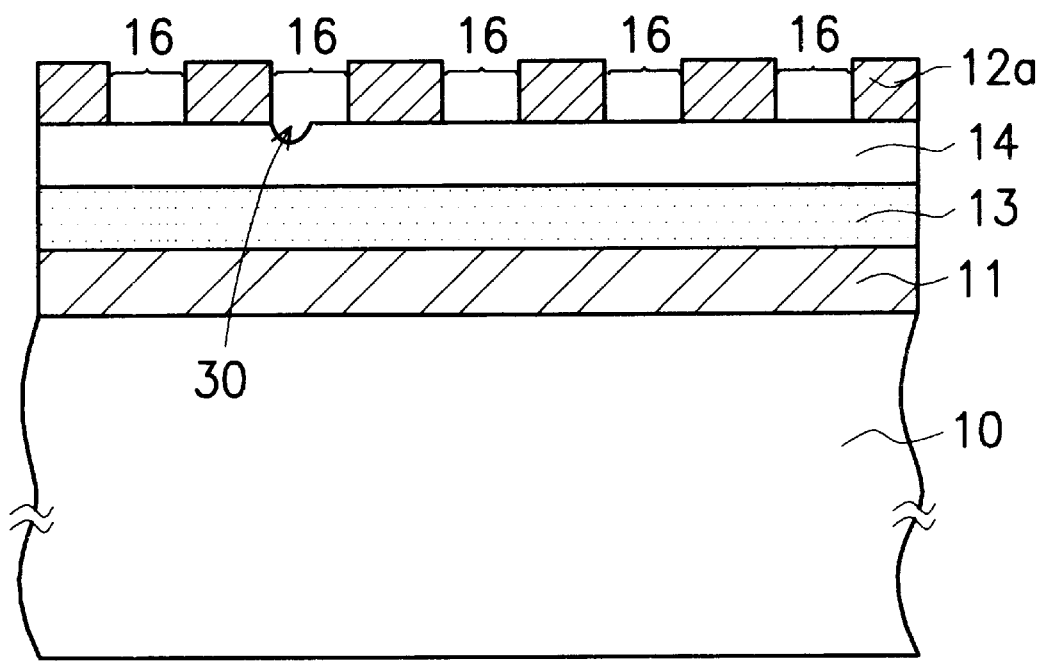

Next, as shown in FIG. 10B, the masking layer 12 is patterned to expose a portion of the phase shifting layer 14 and form a plurality of exposed regions 16. The masking layer 12a remaining on the phase shifting layer 14 becomes the masking region of the phase shifting mask. When the masking layer 12 is patterned, portions of the phase shifting layer 14 in some of the exposed regions 16 are damaged, forming a defective region 30.

Figure 10C:
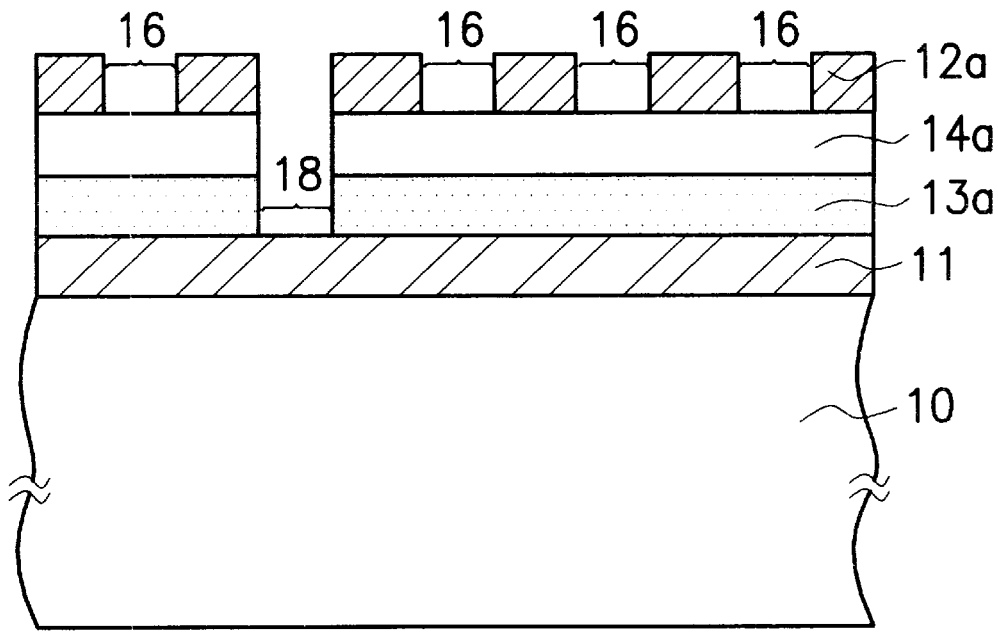

Next, as shown in FIG. 10C, damage detection and repair are conducted. First, defective region 30 in one of the exposed regions 16 is examined by a detecting station. Next, using the phase shifting layer 11 as an etching stop layer, phase shifting layer 14 and the phase shifting layer 13 below it, in the exposed defective region 30, are removed to expose the underlying phase shifting layer 11 and form an exposed regions 18.

Figure 10D:
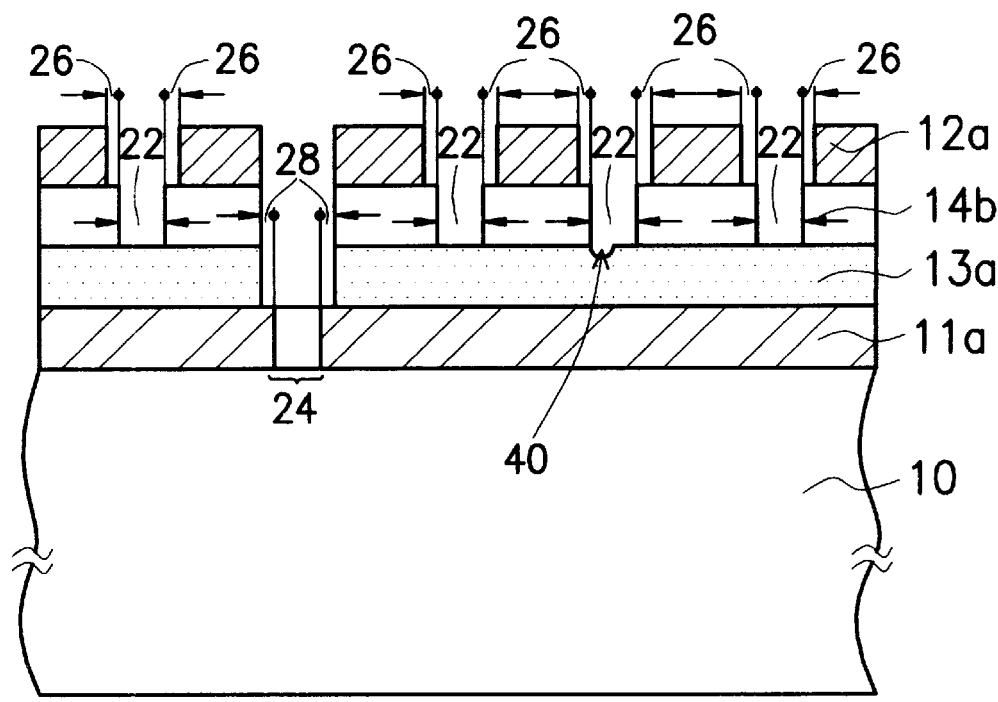

Next, as shown in FIG. 10D, phase shifting regions and light passing regions of the rim phase shifting mask are patterned. First, the phase shifting layer 14a in some of the exposed regions 16 are removed to expose a portion of the phase shifting layer 13a and form exposed regions 22. Furthermore, the phase shifting layer 11 in one of the exposed regions 18 is also removed to expose a portion of the transparent substrate 10 and form an exposed region 24. In other words, the exposed regions 22 and exposed region 24 together form the light passing regions of the phase shifting mask. Regions 26 that expose the remaining phase shifting layer 14b (regions not covered by the masking layer 12a) and region 28 that exposes the remaining phase shifting layer 11a (the region not covered by the phase shifting layer 13a) become the phase shifting regions of the phase shifting mask. When the masking layer 14b is patterned, portions of the phase shifting layer 13b in one of the exposed regions 22 is damaged, forming a defective region 40.

Figure 10E:
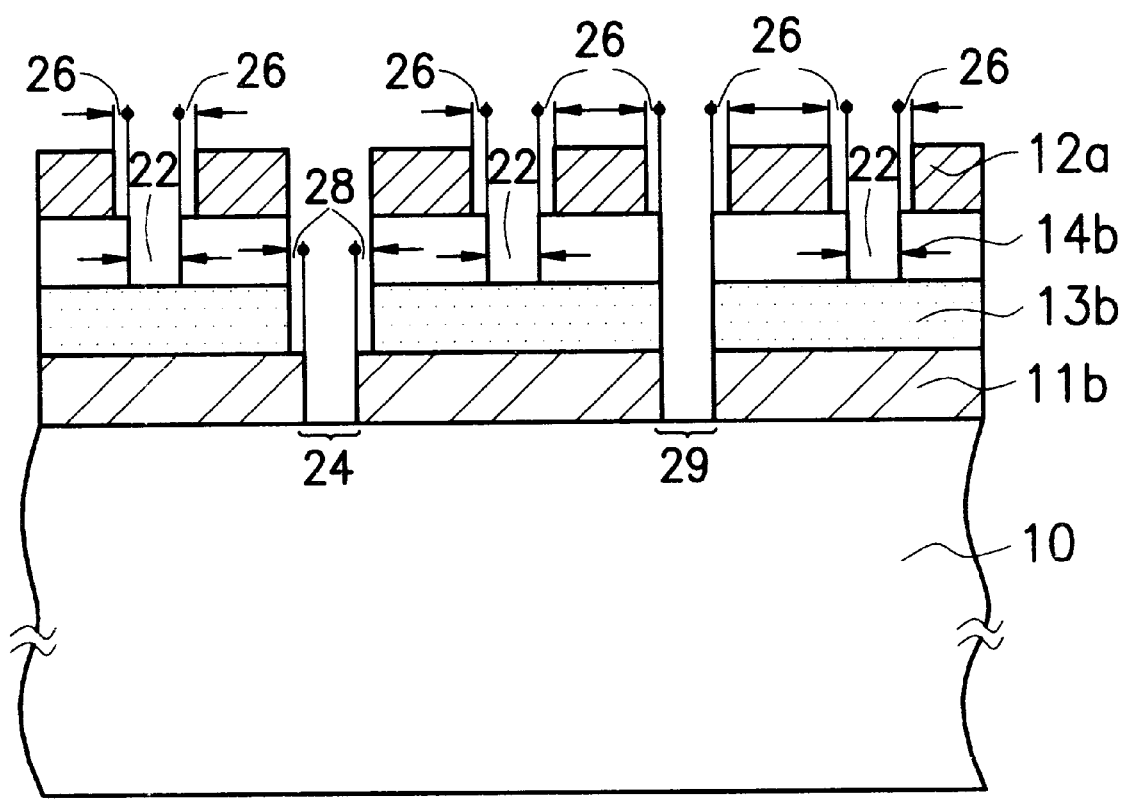

Finally, as shown in FIG. 10E, a second damage detection and repair operation is carried out. First, defective region 40 in one of the exposed regions 22 is examined by a detecting station. Next, using the transparent substrate 10 as an etching stop layer, phase shifting layer 13a and the phase shifting layer 11a below it in the exposed defective region 40 are removed to expose the underlying transparent substrate 10 and form an exposed region 29.

According to the above method of producing a rim phase shifting mask, the phase shifting regions are formed from single phase shifting layer 11b, for example, the exposed region 28. In addition, the phase shifting regions can also be formed from the combination of several layers such as phase shifting layer 14b, 13b and 11b, as in the exposed regions 26, for example. The light passing regions of the phase shifting mask are the exposed transparent substrate 10 in exposed regions 24 and 29, or regions having phase shifting layer 13b and 11b such as the exposed regions 22. Therefore, whether light from a light source passes through the exposed region 24 and the exposed region 29 or through the exposed regions 22, the light still manages to interact with the 180° phase-shifted light that passes through the exposed regions 26 or 28 and produce alternately distributed phase angle shifts of 0° and 180°. Consequently, negative and positive interference is achieved and resolution can be increased.

In summary, this invention utilizes the formation of a 360° phase shifting layer over a transparent substrate before carrying out conventional phase shifting mask manufacturing. Since material for forming the phase shifting layer is different from the layer below it, etching end points are easily controlled when the photomask is repaired. Therefore, damage to the transparent substrate due to etching are prevented and a defect-free mask can be obtained.

Furthermore, this invention also provides a method of forming a phase shifting to mask where three 180° phase shifting mask layers are formed over a transparent substrate first, after which a masking layer is formed over the phase shifting layer. Different etching properties of the three phase shifting layers can be utilized to perform repeated and effective damage repairs of the defective regions when the masking layer or the topmost phase shifting layer is etched. In addition, the transparent substrate is also protected from etching damages by the overlying phase shifting layers. Hence, the phase shifting mask of this invention is able to prevent phase shifting errors and increase resolution of photomask in photolithographic operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for producing a phase shifting mask consisting of:

providing a transparent substrate;

forming a first phase shifting layer abutting the transparent substrate, wherein the first phase shifting layer has a 360° phase shift angle;

forming a second phase shifting layer abutting the first phase shift layer, wherein the second phase shifting layer has a 180° phase shift angle;

patterning the second phase shifting layer to expose a portion of the first phase shifting layer and form a plurality of exposed regions; and performing a damage detection and repair operation such that when the first phase shifting layer in one or more of the exposed regions has defects, the first phase shifting layer in the exposed regions having the defects can be removed to expose the transparent substrate.

2. The method of claim 1, wherein the step of producing a phase shifting mask includes forming a half-tone phase shifting mask.

3. The method of claim 1, wherein before the step of patterning the second phase shifting mask, further includes forming a masking layer over the second phase shifting mask and then patterning the masking layer.

4. The method of claim 3, wherein the step of producing a phase shifting mask includes forming an alternating phase shifting mask.

5. The method of claim 3, wherein the step of producing a phase shifting mask includes forming a rim phase shifting mask.

6. The method of claim 3, wherein the step of forming the masking layer includes depositing chromium.

7. The method of claim 1, wherein the step of performing a damage detection and repair operation is carried out using, a repair station.

8. The method of claim 1, wherein material for forming the transparent substrate includes quartz.

9. The method of claim 1, wherein material for forming the phase shifting layer includes silicon oxynitride.

10. The method of claim 1, wherein the material for forming the phase shifting layer includes molybdenum silicon oxynitride.

11. A method for producing an alternating phase shifting layer comprising:

providing a transparent substrate;

forming a first phase shifting layer abutting the transparent substrate, wherein the first phase shifting layer has a 360° phase shift angle;

forming a masking layer abutting the first phase shifting layer;

patterning the masking layer to expose a portion of the first phase shifting layer and form a plurality of exposed regions;

forming a second phase shifting layer above the transparent substrate abutting the masking layer and the exposed regions, wherein the second phase shifting layer has a 180° phase shift angle wherein the masking layer is located between the first phase shifting layer and the second phase shifting layer;

patterning the second phase shifting layer to expose some of the exposed regions; and performing a damage detection and repair operation such that when the first phase shifting layer in one or more of the exposed regions has defects, the first phase shifting layer in the exposed regions having the defects can be removed to expose the transparent substrate.

12. The method of claim 11, wherein the material for forming the transparent substrate includes quartz.

13. The method of claim 11, wherein the material for forming the phase shifting layer includes silicon oxynitride.

14. The method of claim 11, wherein the material for forming the phase shifting layer includes molybdenum silicon oxynitride.

15. The method of claim 11, wherein the step of forming the masking layer includes depositing chromium.

16. A method for producing a phase shifting mask, comprising the steps of:

provinding a transparent substrate;

forming a first phase shifting layer abutting the transparent substrate, wherein the first phase shifting layer has a 180° phase shift angle;

forming a second phase shifting layer abutting the first phase shifting layer, wherein the second phase shifting layer has a 180° phase shift angle;

forming a third phase shifting layer abutting the second phase shifting layer, wherein the third phase shifting layer has a 180° phase shift angle;

forming a masking layer abutting the third phase shifting layer;

patterning the masking layer to expose a portion of the third phase shifting layer and form a plurality of first exposed regions;

removing the third phase shifting layer in some of the first exposed regions to expose a portion of the second phase shifting layer and form a plurality of second exposed regions; and performing a damage detection and repair operation such that:

when defects are found in the third phase shifting layer of some of the first exposed regions, the third phase shifting layer and the second phase shifting layer below it, in the first exposed regions having the defects, are removed to expose the first phase shifting layer; and when defects are found in the second phase shifting layer of some of the second exposed regions, the second phase shifting layer and the first phase shifting layer below it, in the second exposed regions having the defects, are removed to expose the transparent substrate.

17. The method of claim 16, wherein step of producing the phase shifting mask includes forming an alternating phase shifting mask.

18. The method of claim 16, wherein the material for forming the transparent substrate includes quartz.

19. The method of claim 16, wherein the steps of removing the third phase shifting layer and the damage detection and repair operation are such that the first phase shifting layer has a removal rate different from the second phase shifting layer, and furthermore the second phase shifting layer has a removal rate different from the third phase shifting layer.

20. The method of claim 16, wherein the steps of removing the third phase shifting layer and the damage detection and repair operation include using an etch removal method such that the first phase shifting layer has an etch removal rate different from the second phase shifting layer, and furthermore the second phase shifting layer has an etch removal rate different from the third phase shifting layer.

21. The method of claim 16, wherein the step of forming the masking layer includes depositing chromium.

22. A method for producing an alternating phase shifting mask, wherein the alternating phase shifting mask has a plurality of phase shifting regions and a plurality of light passing regions, comprising the steps of:

providing a transparent substrate;

forming a first phase shifting layer abutting the transparent substrate, wherein the first phase shifting layer has a 180° phase shift angle;

forming a second phase shifting layer abutting the first phase shifting layer, wherein the second phase shifting layer has a 180° phase shift angle;

forming a third phase shifting layer abutting the second phase shifting layer, wherein the third phase shifting layer has a 180° phase shift angle;

forming a masking layer abutting the third phase shifting layer;

patterning the masking layer to expose the third phase shifting layer in the phase shifting regions and the light passing regions;

performing a first damage detection and repair operation such that:

when defects are found in the third phase shifting layer of some of the phase shifting regions, the third phase shifting layer and the second phase shifting layer below it, in the phase shifting regions having the defects, are removed to expose the first phase shifting layer; and when defects are found in the second phase shifting layer of some of the light passing regions, the second phase shifting layer and the first phase shifting layer below it, in the light passing regions having the defects, are removed to expose the transparent substrate;

removing the top layer in the light passing regions such that:

when the light passing regions expose the third phase shifting layer, the third phase shifting layer in the light passing regions are removed to expose the second phase shifting layer; and when the light passing regions expose the first phase shifting layer, the first phase shifting layer in the light passing regions are removed to expose the transparent substrate; and performing a second damage detection and repair operation such that when defects are found in the second phase shifting layer of some of the light passing regions, the second phase shifting layer and the first phase shifting layer below, it in the light passing regions having the defects, are removed to expose the transparent substrate.

23. The method of claim 22, wherein the material for forming the first phase shifting layer and the third phase shifting layer is the same.

24. The method of claim 22, wherein the material for forming the transparent substrate includes quartz.

25. The method of claim 22, wherein the steps of removing the top layer of the light passing regions and the damage detection and repair operation are such that the first phase shifting layer has a removal rate different from the second phase shifting layer and the second phase shifting layer has a removal rate different from the third phase shifting layer.

26. The method of claim 22, wherein the steps of removing the top layer of the light passing regions and the damage detection and repair operation include using an etching method such that the first phase shifting layer has an etch removal rate different from the second phase shifting layer and the second phase shifting layer has an etch removal rate different from the third phase shifting layer.

27. The method of claim 22, wherein the step of forming the masking layer includes depositing chromium.

28. A method for producing a rim phase shifting mask, comprising the steps of:

providing a transparent substrate;

forming a first phase shifting layer abutting the transparent substrate, wherein the first phase shifting layer has a 180° phase shift angle;

forming a second phase shifting layer abutting the first phase shifting layer, wherein the second phase shifting layer has a 180° phase shift angle;

forming a third phase shifting layer abutting the second phase shifting layer, wherein the third phase shifting layer has a 180° phase shift angle;

forming a masking layer abutting the third phase shifting layer;

patterning the masking layer to expose a portion of the third phase shifting layer and form a plurality of first exposed regions;

performing a first damage detection and repair operation such that when defects are found in the third phase shifting layer of some of the first exposed regions, the third phase shifting layer and the second phase shifting layer below it, in the first exposed regions having the defects, are removed to expose the first phase shifting layer;

removing the top layer in the first exposed regions to form a plurality of second exposed regions such that:

when second exposed regions expose the third phase shifting layer, the third phase shifting layer in the second exposed regions are removed to expose the second phase shifting layer; and when the second exposed regions expose the first phase shifting layer, the first phase shifting layer in the second exposed regions are removed to expose the transparent substrate; and performing a second damage detection and repair operation such that when defects are found in the second phase shifting layer of some of the second exposed regions, the second phase shifting layer and the first phase shifting layer below it, in the second exposed regions having the defects, are removed to expose the transparent substrate.

29. The method of claim 28, wherein the material for forming the first phase shifting layer and the third phase shifting layer is the same.

30. The method of claim 28, wherein the material for forming the transparent substrate includes quartz.

31. The method of claim 28, wherein the steps of removing the top layer of some of the first exposed regions and the damage detection and repair operation are such that the first phase shifting layer has a removal rate different from the second phase shifting layer and the second phase shifting layer has a removal rate different from the third phase shifting layer.

32. The method of claim 28, wherein the steps of removing the top layer of the some of the first exposed regions and the damage detection and repair operation include using an etching method such that the first phase shifting layer has an etch removal rate different from the second phase shifting layer and the second phase shifting layer has an etch removal rate different from the third phase shifting layer.

33. The method of claim 28, wherein the step of forming the masking layer includes depositing chromium.

* * * * *